US009326396B2

(12) United States Patent
Mizoguchi et al.

(10) Patent No.: US 9,326,396 B2
(45) Date of Patent: Apr. 26, 2016

(54) ELECTRONIC EQUIPMENT CASING (71) Applicant: LENOVO (SINGAPORE) PTE. LTD., Singapore (SG)

(72) Inventors: Fumitake Mizoguchi, Kanagawa-ken (JP); Tetsuo Ogawa, Kanagawa-ken (JP); Tetsuya Ohtani, Kanagawa-ken (JP); Hiroaki Agata, Kanagawa-ken (JP)

(73) Assignee: LENOVO (SINGAPORE) PTE LTD (SG)

( * ) Notice: Subject to any disclaimer, the term of this patent is extended or adjusted under 35 U.S.C. 154(b) by 46 days.

(21) Appl. No.: 13/799,332

(22) Filed: Mar. 13, 2013

(65) Prior Publication Data
US 2013/0285516 A1    Oct. 31, 2013

(30) Foreign Application Priority Data
Apr. 27, 2012   (JP) ................. 2012-102706

(51) Int. Cl.
*H05K 5/02* (2006.01)
*H05K 5/00* (2006.01)
*G06F 1/16* (2006.01)

(52) U.S. Cl.
CPC ............... *H05K 5/02* (2013.01); *G06F 1/1637* (2013.01); *G06F 1/1658* (2013.01); *H05K 5/0017* (2013.01); *H05K 5/0247* (2013.01); *Y10T 29/49826* (2015.01)

(58) Field of Classification Search
CPC ........ B29C 66/20; B29C 66/05; B29C 66/13; B29C 66/14; B29C 45/0005; B29C 45/14786; G06F 1/1656; G06F 1/1637; G06F 1/1658; G02F 2001/133314; G02F 2001/133325; H05K 5/02; H05K 5/0017; H05K 5/0247

USPC ......... 361/679.21, 800; 349/58, 60, 187, 794; 362/633, 634; 348/794
See application file for complete search history.

(56) References Cited

U.S. PATENT DOCUMENTS

| 5,717,476 | A  | * | 2/1998  | Kanezawa       | 349/149   |
| 5,867,370 | A  | * | 2/1999  | Masuda         | 361/800   |
| 6,721,651 | B1 | * | 4/2004  | Minelli        | 701/538   |
| 7,385,819 | B1 | * | 6/2008  | Shives et al.  | 361/704   |
| 8,379,164 | B2 | * | 2/2013  | Ji et al.      | 349/58    |
| 8,511,498 | B2 | * | 8/2013  | Kenney         | 220/62.22 |
| 8,520,373 | B2 | * | 8/2013  | Liu            | 361/679.03|
| 8,564,732 | B2 | * | 10/2013 | Zhou et al.    | 349/58    |
| 8,576,372 | B2 | * | 11/2013 | Ji et al.      | 349/187   |
| 2003/0026984 | A1 | * | 2/2003 | Nagayama et al.| 428/367   |
| 2005/0237443 | A1 | * | 10/2005| Nakanishi et al.| 349/58   |
| 2006/0232920 | A1 | * | 10/2006| Miyamoto et al.| 361/683   |

(Continued)

FOREIGN PATENT DOCUMENTS

JP    01-112096    7/1989
JP    2009-169506  7/2009

(Continued)

*Primary Examiner* — Patrick Hawn
(74) *Attorney, Agent, or Firm* — Antony P. Ng; Russell Ng PLLC (57) ABSTRACT

A casing for electronic equipments is disclosed. The casing includes a first region and a second region. The first region is formed by a foamed layer provided between an outer rigid layer and an inner rigid layer. The foamed layer isolates the outer rigid layer from the inner rigid layer. The second region is formed by a single layer of material, and the single layer of material is joined to the outer rigid layer, the formed layer and the inner rigid layer.

7 Claims, 11 Drawing Sheets

(56) References Cited

U.S. PATENT DOCUMENTS

| | | | |
|---|---|---|---|
| 2008/0151502 A1* | 6/2008 | Shives et al. | 361/704 |
| 2009/0179806 A1* | 7/2009 | Ji et al. | 343/702 |
| 2009/0185340 A1* | 7/2009 | Ji et al. | 361/679.21 |
| 2009/0219459 A1* | 9/2009 | Kim | 349/58 |
| 2009/0303408 A1* | 12/2009 | Huang et al. | 349/58 |
| 2010/0039578 A1* | 2/2010 | Roh et al. | 349/58 |
| 2010/0066937 A1* | 3/2010 | Yamashita et al. | 349/58 |
| 2013/0027628 A1* | 1/2013 | Zhou et al. | 349/58 |
| 2013/0147079 A1* | 6/2013 | Ji et al. | 264/105 |

FOREIGN PATENT DOCUMENTS

| | | |
|---|---|---|
| JP | 2009-244918 | 10/2009 |
| JP | 2009-262530 | 11/2009 |
| JP | 2011-156587 | 8/2011 |
| JP | 2011-165206 | 8/2011 |
| JP | 2012-038268 | 2/2012 |

\* cited by examiner

ELECTRONIC EQUIPMENT CASING

PRIORITY CLAIM

The present application claims benefit of priority under 35 U.S.C. §§120, 365 to the previously filed Japanese Patent Application No. JP2012-102706 with a priority date of Apr. 27, 2012, which is incorporated by reference herein.

BACKGROUND OF THE INVENTION

1. Technical Field

The present invention relates to casings in general, and more particularly to an electronic equipment casing.

2. Description of Related Art

Nowadays, many electronic equipments, such as laptop personal computers (PCs), are usually equipped with a wireless antenna. The wireless antenna is so arranged that the antenna will become most sensitive when the electronic equipment is used. In a laptop PC, the antenna is placed above or beside a liquid-crystal display (LCD).

In order to place the wireless antenna above or beside the LCD, it is required that an area of a casing where the wireless antenna is placed be made of a non-conductive material, and the area of the casing where the LCD is housed be made of a lightweight material having excellent strength.

Non-conductive materials such as aramid fiber or the like tend to be inferior in strength to the conductive materials. On the other hand, conductive materials such as carbon fiber are lightweight and with excellent strength, but they are unfit to be used in conjunction with wireless antennae.

Consequently, it would be desirable to provide an improved electronic equipment casing for containing an antenna along with a LCD.

SUMMARY OF THE INVENTION

In accordance with a preferred embodiment of the present disclosure, a casing for electronic equipments includes a first region and a second region. The first region is formed by a foamed layer provided between an outer rigid layer and an inner rigid layer. The foamed layer isolates the outer rigid layer from the inner rigid layer. The second region is formed by a single layer of material, and the single layer of material is joined to the outer rigid layer, the formed layer and the inner rigid layer.

All features and advantages of the present disclosure will become apparent in the following detailed written description.

BRIEF DESCRIPTION OF THE DRAWINGS

The disclosure itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 17:
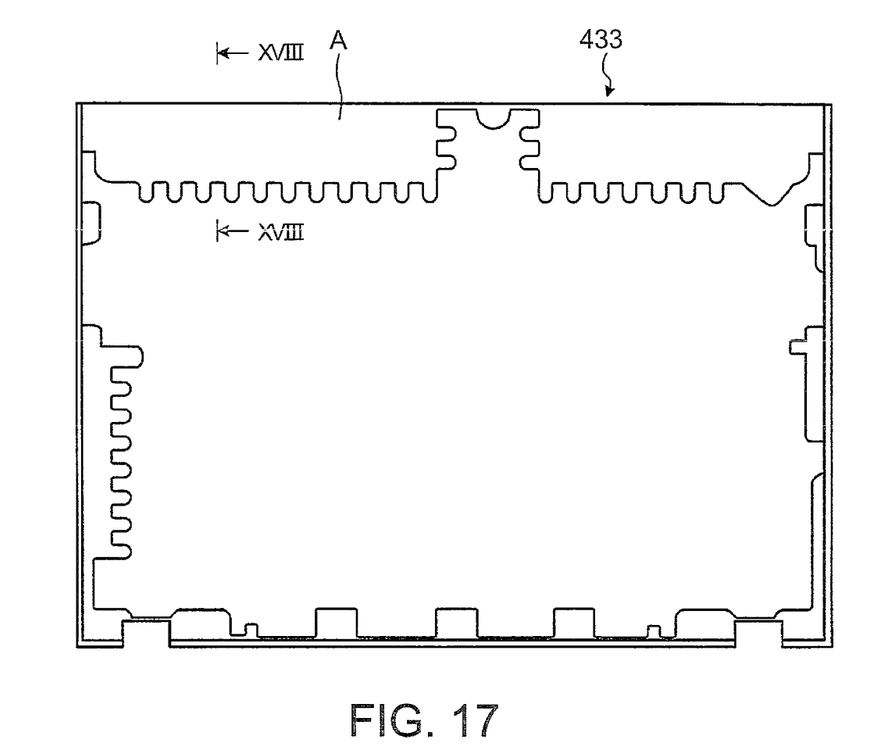
FIG. 17 is a top view of a conventional casing.
Figure 18:
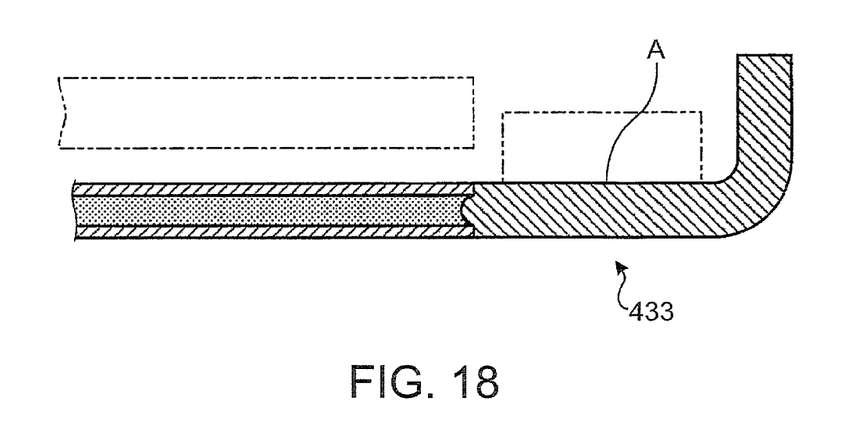
FIG. 18 is a cross-sectional view of the casing shown in FIG. 17 at XVIII-XVIII.

FIG. 17 is a top view of a conventional casing, and FIG. 18 is a cross-sectional view of the casing shown in FIG. 17 at XVIII-XVIII. As shown, an electronic equipment casing 433 includes an area A to be made non-conductive, and so it is made of a non-conductive material, an area to be made highly strong, and so it is made of a conductive material. The area A to be made non-conductive and the area to be made highly strong are joined together, as shown in FIG. 18.

Figure 1:
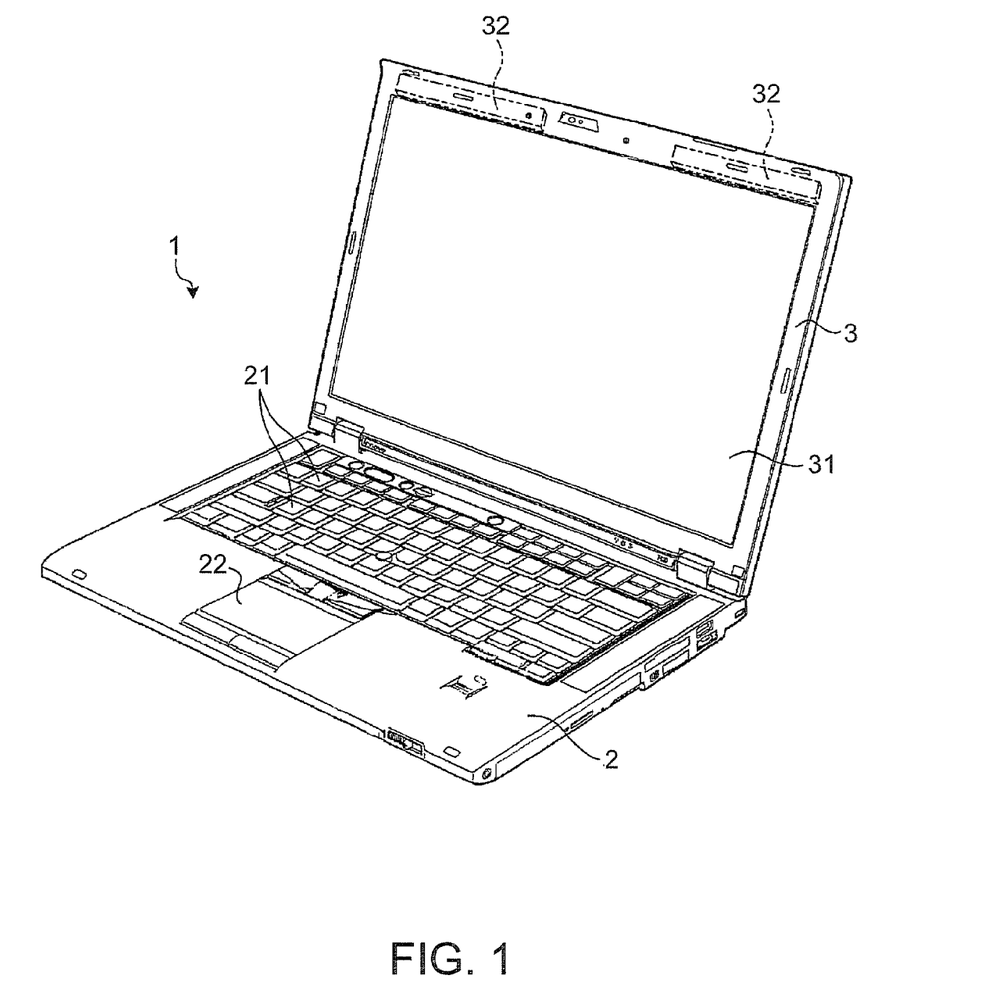
FIG. 1 is a perspective view of a laptop PC in which a preferred embodiment of the present invention can be incorporated, where a cover body is opened from a PC main body.
Figure 2:
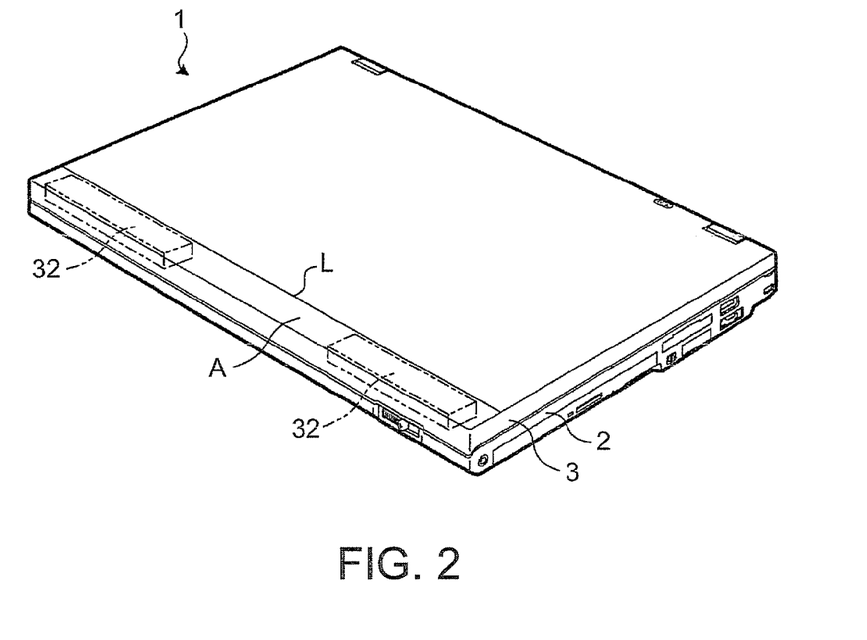
FIG. 2 is a perspective view of the laptop PC in FIG. 1, where the cover body is closed over the PC main body.

FIGS. 1 and 2 are perspective views showing a laptop personal computer (PC) as an embodiment of the present invention, where FIG. 1 shows such a state that a cover body is opened from a PC main body, and FIG. 2 shows such a state that the cover body is closed over the PC main body. As shown in FIGS. 1 and 2, a laptop PC 1 as the embodiment of the present invention includes a PC main body 2 and a cover body 3 supported to be openable and closable with respect to the PC main body 2. On the top face of the PC main body 2, input units such as operation keys 21 and a touch-pad 22 are provided to enter various pieces of information. These input units are covered with the cover body 3 when the cover body 3 is closed over the PC main body 2 (see FIG. 2). Further, a liquid crystal display (LCD) 31 for displaying various pieces of information is provided on the front face of the cover body 3. The LCD 31 is covered with the PC main body 2 when the cover body 3 is closed over the PC main body 2 (see FIG. 2).

As shown in FIGS. 1 and 2, the laptop PC 1 as the embodiment of the present invention comes already equipped with a wireless antenna 32 in a position above the LCD 31. Therefore, an area A where non-conductivity is given preference over strength is provided in a casing 33 used for the cover body 3 to install the wireless antenna 32 therein (see FIG. 2).

Figure 3:
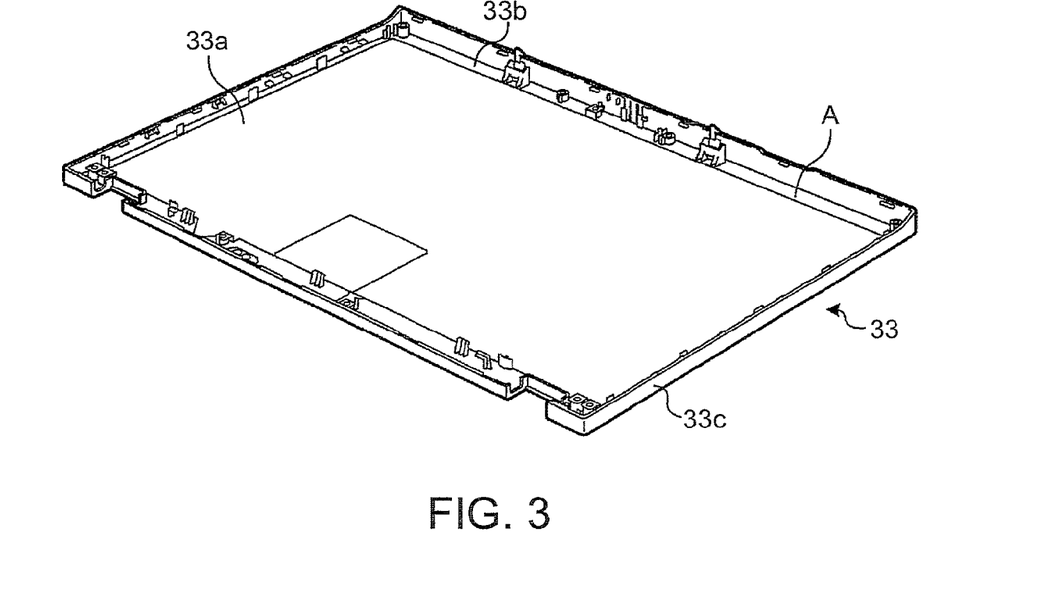
FIG. 3 is a perspective view of a casing used for the cover body shown in FIGS. 1 and 2.
Figure 4:
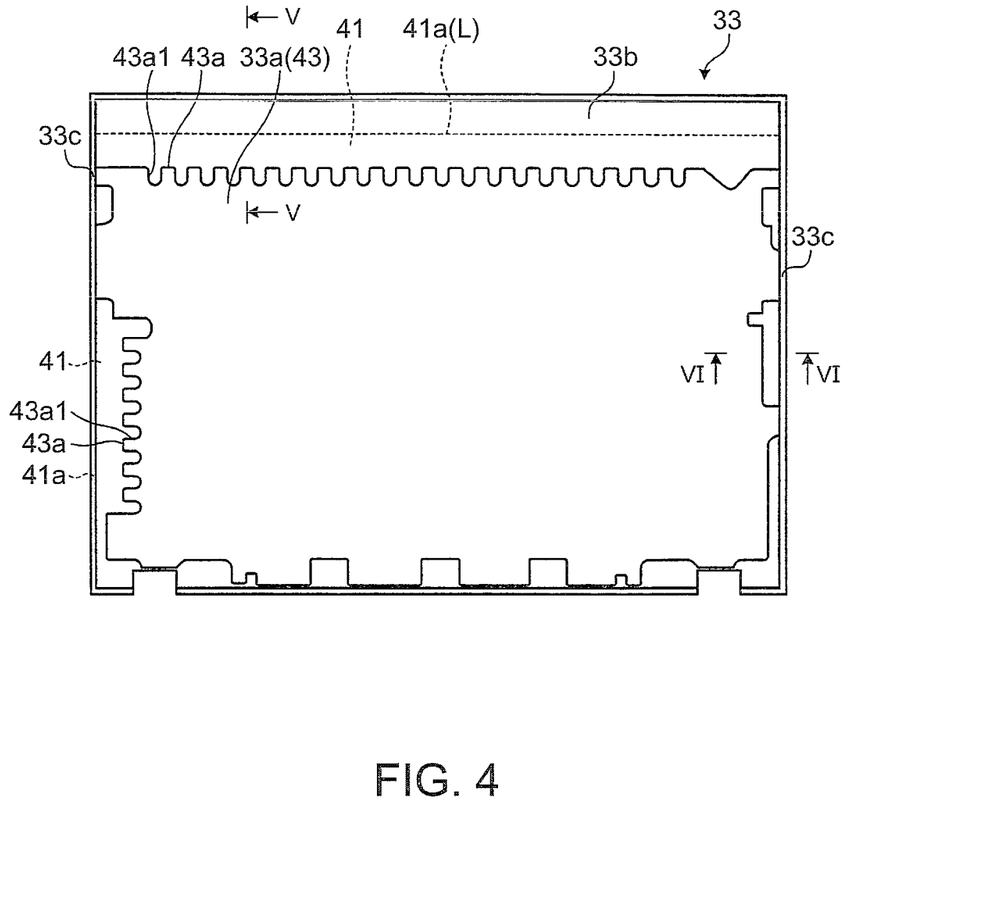
FIG. 4 is a top view of the casing shown in FIG. 3.
Figure 5:
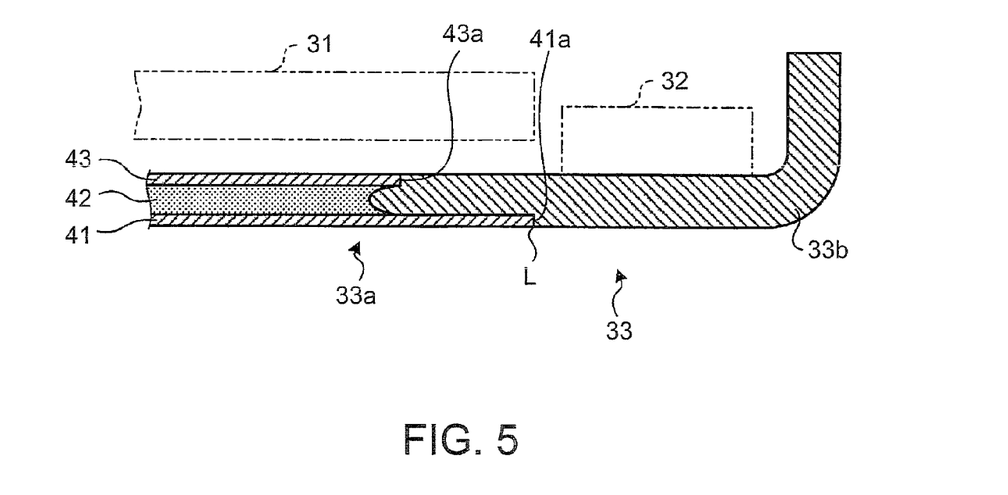
FIG. 5 is a cross-sectional view of the casing shown in FIG. 4 at V-V.

FIG. 3 is a perspective view showing a casing used for the cover body shown in FIGS. 1 and 2. FIG. 4 is a top view of the casing shown in FIG. 3. FIG. 5 is a cross-sectional view of the casing shown in FIG. 4 at V-V, and FIG. 6 is a cross-sectional view of the casing shown in FIG. 4 at VI-VI.

As shown in FIG. 3 to FIG. 5, the casing 33 used for the cover body 3 has a lightweight plate-like part 33a having excellent strength, an antenna part 33b superior in non-conductivity to the plate-like part 33a, and a marginal part 33c superior in moldability to the plate-like part 33a.

Figure 6:
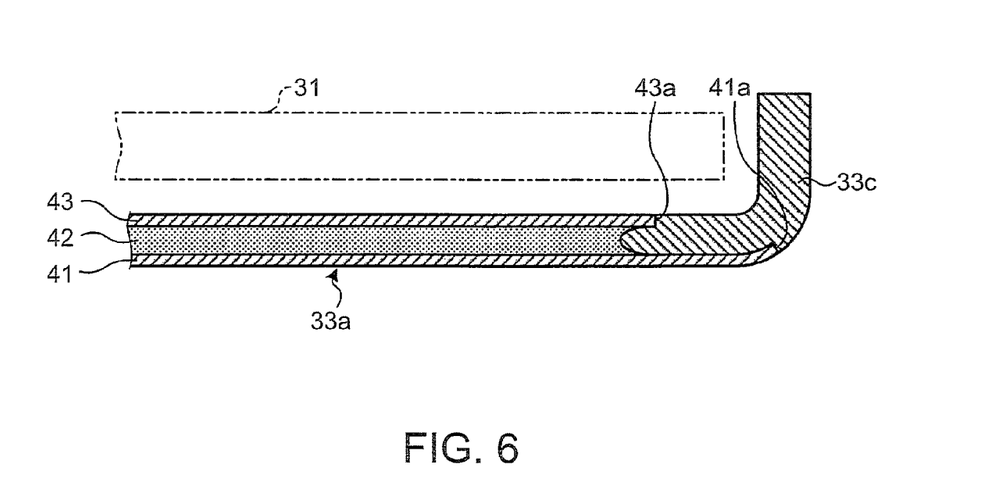
FIG. 6 is a cross-sectional view of the casing shown in FIG. 4 at VI-VI.

As shown in FIGS. 5 and 6, the plate-like part 33a is made of three-layered fiber-reinforced plastic, while the antenna part 33b and the marginal part 33c are made of single-layered fiber-reinforced plastic. The plate-like part 33a has an outer rigid layer 41, a foamed layer 42, and an inner rigid layer 43 in the thickness direction, and the antenna part 33b or the marginal part 33c is jointed to the outline of the plate-like part 33a.

The outer rigid layer 41 is a rigid layer, and a boundary line L between the outer rigid layer 41 and the antenna part 33b appears on the outer surface of the casing 33 (see FIG. 2). The outer rigid layer 41 is made of woven or two-layered carbon fiber (CFRP). When the outer rigid layer 41 is made of woven carbon fiber, the woven texture appears on the outer surface of the casing 33. On the other hand, when the outer rigid layer 41 is made of two-layered carbon fiber, fiber yarns are aligned in one direction so that upper-layer carbon fiber will intersect with lower-layer carbon fiber, and hence such a fiber pattern that fiber yarns are aligned in one direction appears on the outer surface of the casing 33.

The foamed layer 42 is provided between the outer rigid layer 41 and the inner rigid layer 43 to isolate the outer rigid layer 41 and the inner rigid layer 43. As a result, the plate-like part 33a has a large section modulus with a lightweight and excellent-strength structure.

As shown in FIG. 4 to FIG. 6, the inner rigid layer 43 is a rigid layer appearing on the inner surface of the casing 33, and the outline 43a of the inner rigid layer 43 is formed more inwardly than the outline 41a of the outer rigid layer 41. As a result, the inner rigid layer 43 is hidden in the outer rigid layer 41 without appearing on the outer surface of the casing 33. Therefore, as shown in FIG. 4, even if concave portions 43a1 are provided to increase the junction area of the inner rigid layer 43 with the antenna part 33b or the marginal part 33c, the curved patterns will not appear on the outer surface of the casing 33.

Further, as a result of forming the outline 43a of the inner rigid layer 43 more inwardly than the outline 41a of the outer rigid layer 41, a step is made between the outline 43a of the inner rigid layer 43 and the outline 41a of the outer rigid layer 41. Therefore, the outer peripheral edge of the outer rigid layer 41 as the step becomes a join surface to the antenna part 33b or the marginal part 33c.

The single-layered fiber-reinforced plastic that is formed into the antenna part 33b and the marginal part 33c is excellent in non-conductivity and moldability, which is made of glass fiber (GFRP).

The joint part between the inner rigid layer 43 and antenna part 33b, and the joint part between the inner rigid layer 43 and the marginal part 33c do not appear on the outer surface of the above-mentioned casing 33, resulting in an excellent appearance of the casing 33.

Figure 7:
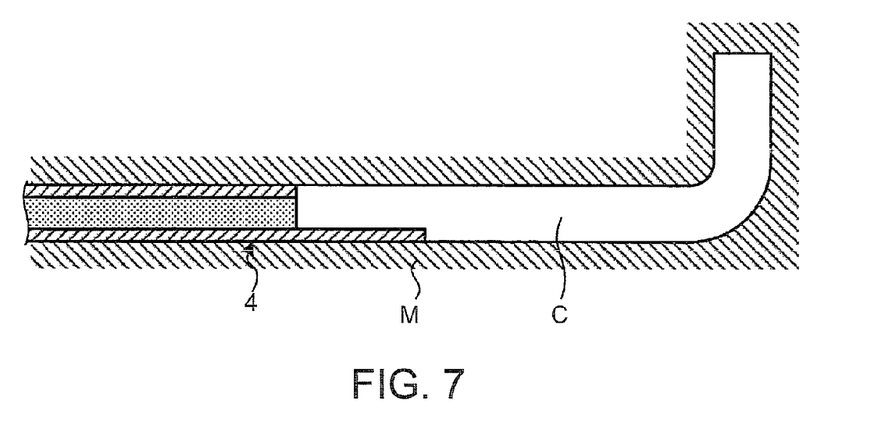
FIG. 7 is a cross-sectional view for describing a method of manufacturing the casing shown in FIG. 4, which corresponds to FIG. 5.
Figure 8:
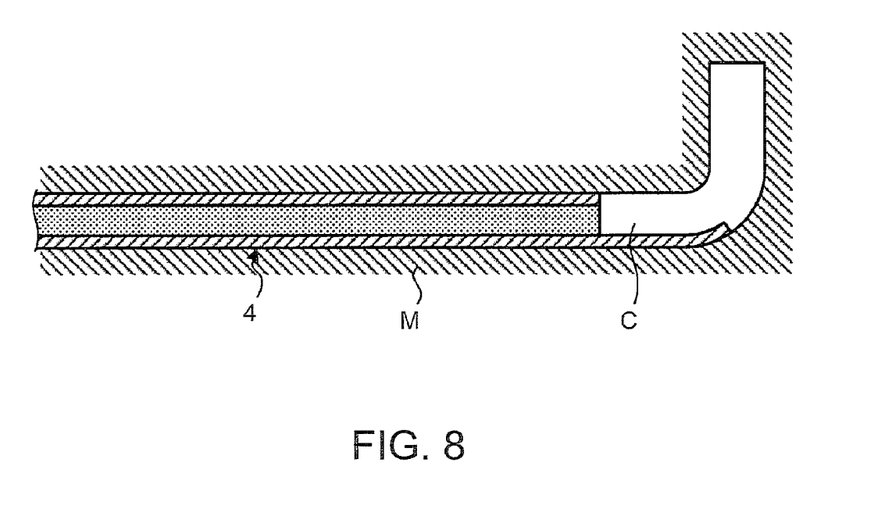
FIG. 8 is a cross-sectional view for describing the method of manufacturing the casing shown in FIG. 4, which corresponds to FIG. 6.

FIGS. 7 and 8 are cross-sectional views for describing a method of manufacturing the casing shown in FIG. 4, where FIG. 7 corresponds to FIG. 5 and FIG. 8 corresponds to FIG. 6. The casing 33 is manufactured using a prepreg of three-layered fiber-reinforced plastic and molten fiber-reinforced plastic.

Specifically, as shown in FIG. 7 and FIG. 8, a casing material 4 (the prepreg of three-layered fiber-reinforced plastic) that is formed into the plate-like part 33a is set in a mold M, and the molten fiber-reinforced plastic is filled up in a cavity C provided in the mold M. Thus, the fiber-reinforced plastic is injection-molded so that the antenna part 33b or the marginal part 33c will be formed in the outline of the plate-like part 33a as shown in FIGS. 5 and 6. At this time, the fiber-reinforced plastic that is formed into the antenna part 33b or the marginal part 33c penetrates into the foamed layer 42 that forms part of the plate-like part 33a, and the antenna part 33b or the marginal part 33c obtains an anchor effect after that.

In the above-mentioned method of manufacturing the casing, since the casing material that is formed into the plate-like part 33a is set in the mold M and the molten fiber-reinforced plastic is filled up in the cavity C provided in the mold M to form the antenna part 33b or the marginal part 33c as a non-conductive area at the outer side of the plate-like part 33a, there is no need to joint the antenna part 33b or the marginal part 33c to the plate-like part 33a after the antenna part 33b or the marginal part 33c is formed.

Figure 9:
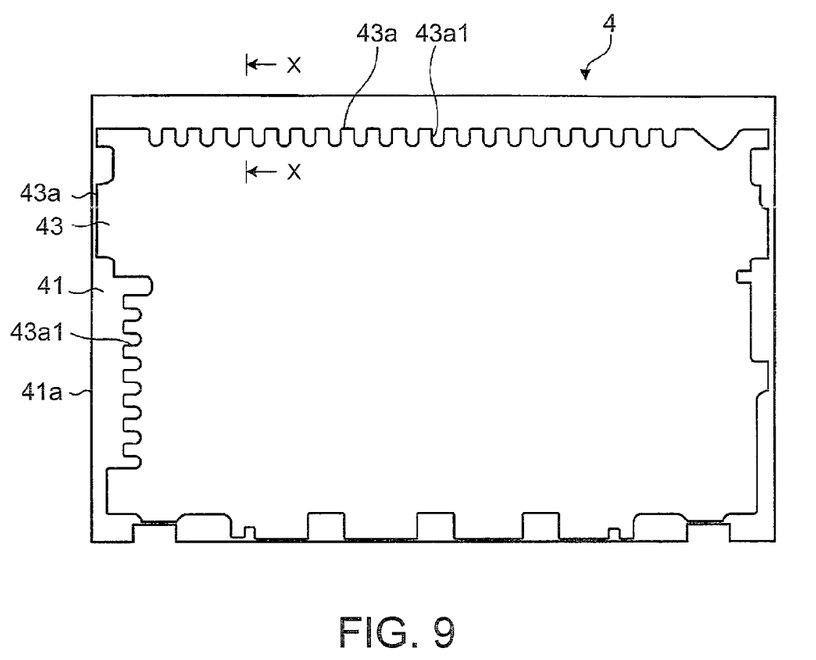
FIG. 9 is a top view of a casing material that forms a plate-like part shown in FIG. 4.
Figure 10:
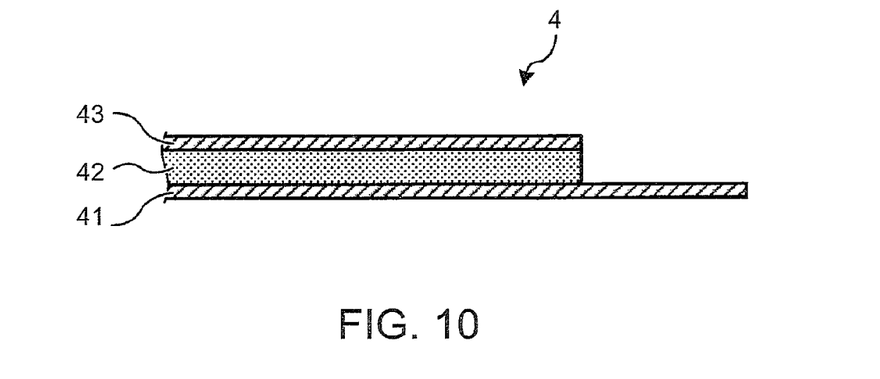
FIG. 10 is a cross-sectional view of the casing material shown in FIG. 10 at X-X.

FIG. 9 is a top view showing the casing material that is formed into the plate-like part shown in FIG. 4. FIG. 10 is a cross-sectional view of the casing material shown in FIG. 9 at X-X. As shown in FIGS. 9 and 10, the casing material 4 that is formed into the plate-like part 33a is made up of the outer rigid layer 41, the foamed layer 42, and the inner rigid layer 43, and the antenna part 33b or the marginal part 33c is jointed to the outline (see FIG. 5 and FIG. 6).

The outer rigid layer 41 is made of woven or two-layered carbon fiber (CFRP). When the outer rigid layer 41 is made of woven carbon fiber, the woven texture appears outwardly. On the other hand, when the outer rigid layer 41 is made of two-layered carbon fiber, fiber yarns are aligned in one direction so that the upper layer of carbon fiber will intersect with the lower layer of carbon fiber, and hence such a fiber pattern that fiber yarns are aligned in one direction appears outwardly.

As shown in FIG. 9 and FIG. 10, the foamed layer 42 is provided between the outer rigid layer 41 and the inner rigid layer 43 to isolate the outer rigid layer 41 and the inner rigid layer 43. As a result, the casing material 4 has a large section modulus with a lightweight and excellent-strength structure.

Like the outer rigid layer 41, the inner rigid layer 43 is made of woven or two-layered carbon fiber (CFRP). Further, as shown in FIG. 10, the outline 43a of the inner rigid layer 43 is formed more inwardly than the outline 41a of the outer rigid layer 41, and as shown in FIG. 9, concave portions 43a1 are provided at predetermined pitches to obtain a join strength to the antenna part 33b or the marginal part 33c.

Since the above-mentioned casing material 4 is so configured that the outline 43a of the inner rigid layer 43 will be formed more inwardly than the outline 41a of the outer rigid layer 41, the outline 43a of the inner rigid layer 43 does not appear on the outer surface of the casing 33, resulting in an excellent appearance of the casing 33. For example, as shown in FIG. 9, even if the concave portions 43a1 are provided in the outline 43a of the inner rigid layer 43 at the predetermined pitches, the pattern of the depressed portions 43a1 does not appear on the outer surface of the casing 33.

Figure 11:
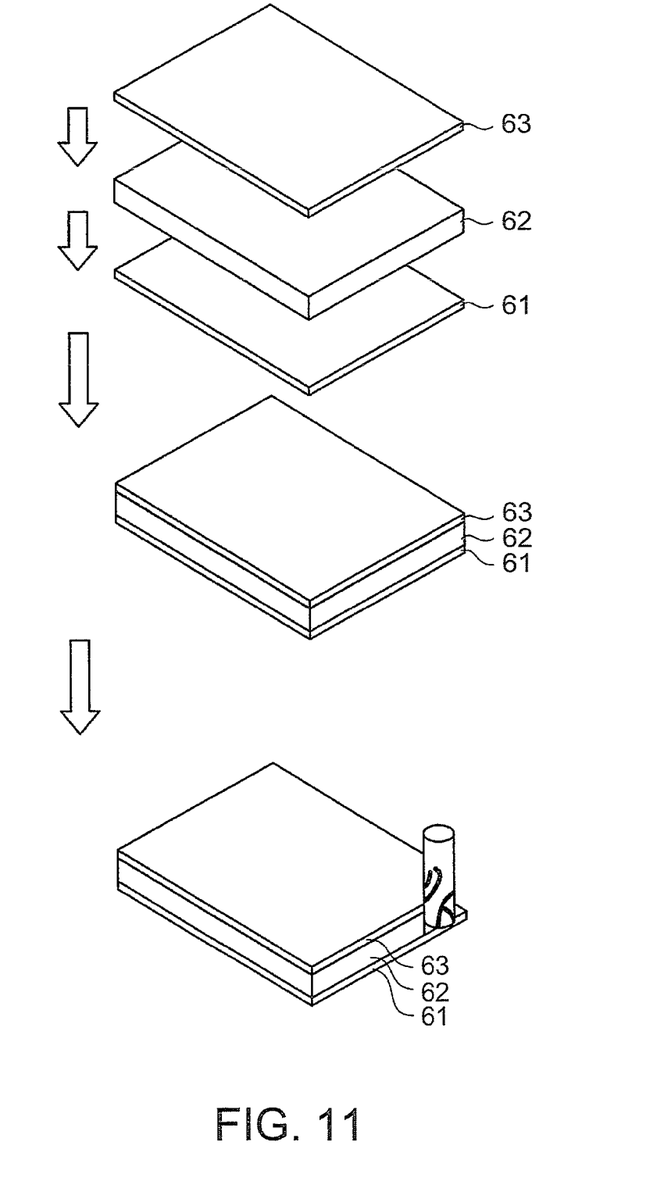
FIG. 11 describes a method of manufacturing the casing material shown in FIG. 9.

FIG. 11 illustrates a method of manufacturing the casing material shown in FIG. 9. As shown in FIG. 11, a rigid sheet 61 formed into the outer rigid layer 41, a foamed sheet 62 formed into the foamed layer 42, and a rigid sheet 63 formed into the inner rigid layer 43 are first laminated in this order to produce three-layered fiber-reinforced plastic. Next, the rigid sheet 63 formed into the inner rigid layer 43 and the foamed sheet 62 formed into the foamed layer 42 are so trimmed that the outline of the inner rigid layer 43 of the produced three-layered fiber-reinforced plastic will be more inward than the outline of the outer rigid layer 41. Specifically, as shown in FIG. 9, the rigid sheet 63 and the foamed sheet 62 are trimmed to form the concave portions 43a1 in order to obtain a join strength to the antenna part 33b or the marginal part 33c. Thus, the casing material 4 shown in FIG. 9 and FIG. 10 is obtained. Note that, since the rigid sheet 63 and the foamed sheet 62 are trimmed not to damage the rigid sheet 61 formed into the outer rigid layer 41 in order to obtain the performance of the outer rigid layer 41, the foamed layer 42 may remain. However, since the remaining foamed layer 42 melts by the molten fiber-reinforced plastic, this is not a drawback.

In the above-mentioned method of manufacturing the casing material, since the rigid sheet 63 formed into the inner rigid layer 43 and the foamed sheet 62 formed into the foamed layer 42 are trimmed after the three-layered fiber-reinforced plastic is produced, there is no need to position and laminate the rigid sheet 61 formed into the outer rigid layer, the foamed sheet 62 formed into the foamed layer 42, and the rigid sheet 63 formed into the inner rigid layer 43.

Figure 12:
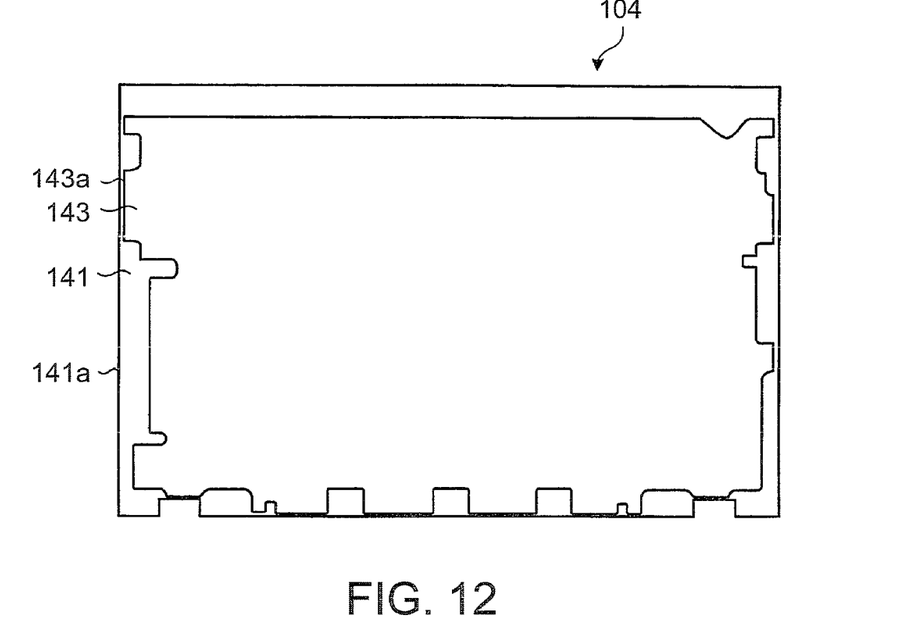
FIG. 12 is a top view showing a casing material different in form from the casing material shown in FIG. 9.

FIG. 12 is a top view of a casing material different in form from the casing material shown in FIG. 9. A casing material 104 shown in FIG. 12 is that an outline 143a of an inner rigid layer 143 is approximated to be more linear than the outline 43a of the inner rigid layer 43 shown in FIG. 9. This is because a step is made between the inner rigid layer 143 and an outline 141a of an outer rigid layer 141, and the outer peripheral edge of the outer rigid layer 141 as the step becomes a join surface to the antenna part 33b or the marginal part 33c, so that the join strength between the plate-like part 33a and the antenna part 33b, and between the plate-like part 33a and the marginal part 33c is secured to eliminate the need to provide the depressed portions 43a1 as shown in FIG. 9.

Figure 13:
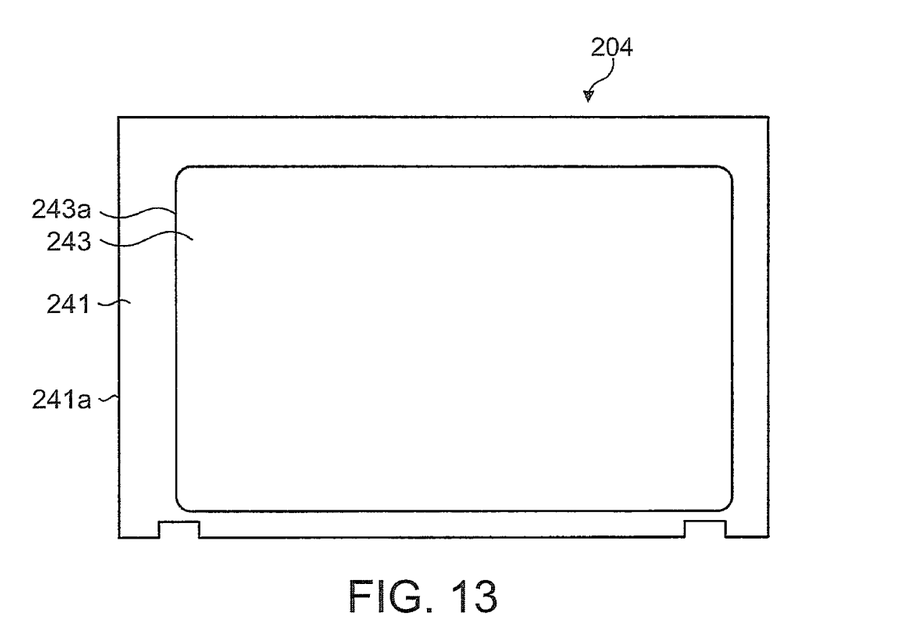
FIG. 13 is a top view showing a casing material different in form from the casing materials shown in FIG. 9 and FIG. 12.

FIG. 13 is a top view of a casing material different in form from the casing materials shown in FIGS. 9 and 12. A casing material 204 shown in FIG. 13 is that an outline 243a of an inner rigid layer 243 is approximated to be more rectangular than the outline 143a of the inner rigid layer 143 shown in FIG. 12. This is not only because the join strength between the plate-like part 33a and the antenna part 33b, and between the plate-like part 33a and the marginal part 33c is secured to eliminate the need to provide the depressed portions 43a1 as shown in FIG. 9 along the outline 243a of the inner rigid layer 243, but also because the approximation of the outline 243a of the inner rigid layer 243 to a rectangle makes manufacturing easy.

Figure 14:
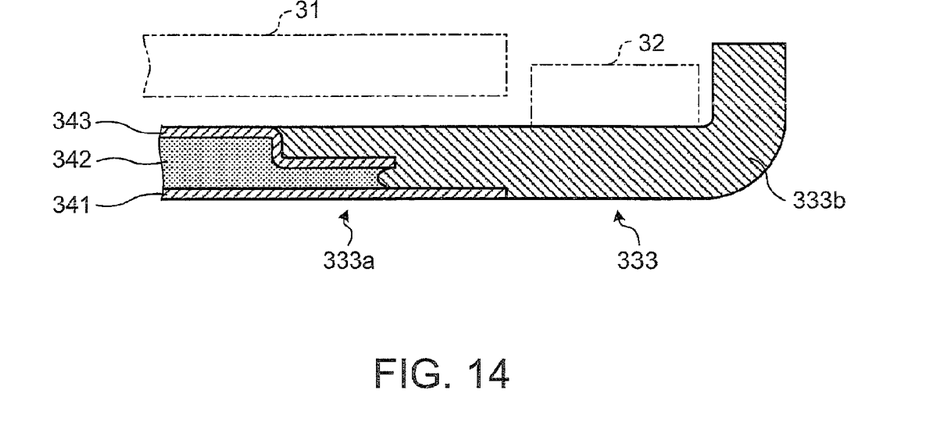
FIG. 14 is a cross-sectional view showing a casing different in form from the casing shown in FIG. 3 to FIG. 6, which corresponds to FIG. 5.
Figure 15:
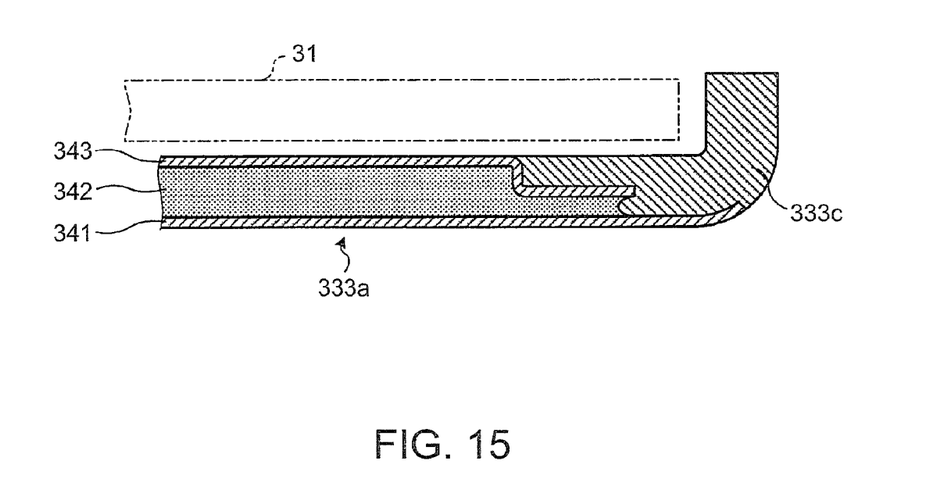
FIG. 15 is a cross-sectional view of the casing shown in FIG. 14, which corresponds to FIG. 6.

FIGS. 14 and 15 are cross-sectional views showing a casing different in form from the casing shown in FIG. 3 to FIG. 6, where FIG. 14 corresponds to FIG. 5 and FIG. 15 corresponds to FIG. 6. The foamed layer 42 of the plate-like part 33a of the casing 33 shown in FIG. 3 to FIG. 6 is created at a twofold foam expansion ratio (with a thickness twice the thickness of the outer rigid layer 41 and the inner rigid layer 43). In contrast, a foamed layer 342 of a plate-like part 333a of a casing 333 shown in FIGS. 14 and 15 is created at a fourfold foam expansion ratio in a central section (with a thickness four times the thickness of the outer rigid layer 341 and the inner rigid layer 343), and at a twofold foam expansion ratio in an outer edge section (with a thickness twice the thickness of the outer rigid layer 341 and the inner rigid layer 343). This is created by compression-molding only the outer edge section from the inside in the thickness direction of the inner rigid layer 343 after the foamed layer 342 is created at the fourfold foam expansion ratio.

Since the plate-like part 333a of the casing 333 shown here has a large section modulus in the central section, the thickness of the outer rigid layer 341 and the inner rigid layer 343 can be made thin, and hence the weight of the plate-like part 33a can be reduced. Further, since the amount of penetration of the fiber-reinforced plastic into the outer edge section is limited, the joint strength between the plate-like part 33a and the antenna part 33b, and between the plate-like part 33a and the marginal part 33c can be secured.

In addition, since only the outer edge section is compression-molded from the inside in the thickness direction of the inner rigid layer 343, any indentation caused by compression is not left on the outer surface of the outer rigid layer 341 and hence the appearance is not disfigured.

Figure 16:
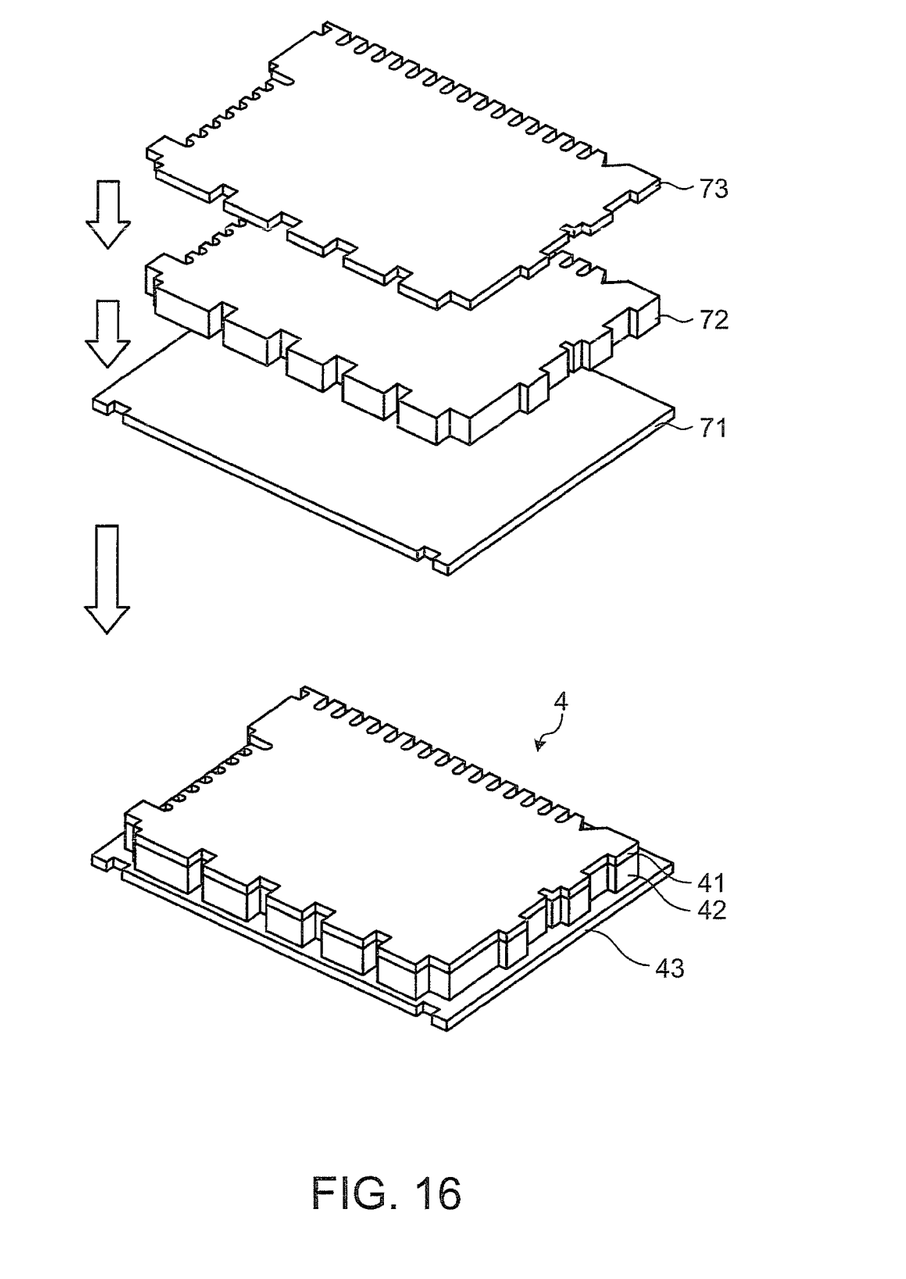
FIG. 16 describes a method of manufacturing a casing material different in form from the method of manufacturing the casing material shown in FIG. 11.

FIG. 16 illustrates a method of manufacturing a casing material different in form from the method of manufacturing the casing material shown in FIG. 11. In the method of manufacturing a casing material shown in FIG. 16, a rigid sheet 71 formed into the outer rigid layer 41 and a rigid sheet 71 formed into the inner rigid layer 43 are first cut out of a rigid sheet, and a foamed sheet 72 formed into a foamed layer is cut out of a foamed sheet. Next, the rigid sheet 71, the foamed sheet 72, and the rigid sheet 73 are mutually positioned, laminated in this order, and integrated to obtain the casing material 4.

In the method of manufacturing the casing material shown here, since the rigid sheet 71 formed into the outer rigid layer 41, the foamed sheet 72 formed into the foamed layer 42, and the rigid sheet 73 formed into the inner rigid layer 43 are laminated in this order and integrated after the rigid sheet 71 formed into the outer rigid layer 41 and the rigid sheet 73 formed into the inner rigid layer 43 are cut out of a rigid sheet and the foamed sheet 72 formed into the foamed layer 42 is cut out of the foamed sheet, there is no need to trim the rigid sheet 73 and the foamed sheet 72.

As has been described, the present disclosure provides a method for manufacturing electronic equipment casing.

While the disclosure has been particularly shown and described with reference to a preferred embodiment, it will be understood by those skilled in the art that various changes in form and detail may be made therein without departing from the spirit and scope of the disclosure.

What is claimed is:

1. A casing for electronic equipment, said casing comprising:
    a plate-like part formed by a foamed layer provided between an outer rigid layer and an inner rigid layer to isolate said outer rigid layer from said inner rigid layer, wherein said inner rigid layer includes a step and is made of carbon-fiber reinforced plastic, and said outer rigid layer is made of carbon-fiber reinforced plastic;
    an antenna part formed by a single layer of material made of glass-fiber reinforced plastic, wherein said antenna part is joined to said plate-like part at said step to form a first edge of said casing to support an antenna; and
    a marginal part formed by a single layer of material made of glass-fiber reinforced plastic, wherein said marginal part is joined to said plate-like part at said step to form a second edge of said casing, wherein the length of said marginal part is shorter than the length of said antenna part.

2. The casing of claim 1, wherein an outline of said inner rigid layer includes a concave portion.

3. The casing of claim 2, wherein said outline of said inner rigid layer includes a plurality of depressed portions at predetermined pitches.

4. The casing of claim 1, wherein an outer edge section of said foamed layer is compression-molded.

5. The casing of claim 2, wherein an outline of said outer rigid layer is a straight edge.

6. The casing of claim 1, wherein said plate-like part is configured to receive a liquid-crystal display.

7. The casing of claim 6, wherein said marginal part is configured to secure said liquid-crystal display.

* * * * *